(12) United States Patent
Morgan et al.

(10) Patent No.: US 6,246,262 B1
(45) Date of Patent: Jun. 12, 2001

(54) OUTPUT BUFFER FOR A LOW VOLTAGE DIFFERENTIAL SIGNALING RECEIVER

(75) Inventors: Mark W. Morgan, Allen; Fernando D. Carvajal, Fairview, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/512,995

(22) Filed: Feb. 24, 2000

Related U.S. Application Data
(60) Provisional application No. 06/121,357, filed on Feb. 24, 1999.

(51) Int. Cl.$^7$ ............................................... H03K 19/0185
(52) U.S. Cl. .............................................. 326/81; 326/86
(58) Field of Search .......................... 326/17, 27, 57–58, 326/112, 119, 121, 80, 81, 83, 86, 87; 327/534, 544

(56) References Cited
U.S. PATENT DOCUMENTS

| | | |
|---|---|---|
| 4,498,022 | 2/1985 | Koyama et al. . |
| 5,081,374 | 1/1992 | Davis . |
| 5,151,619 | 9/1992 | Austin et al. . |
| 5,270,589 | 12/1993 | Sawada et al. . |
| 5,418,476 * | 5/1995 | Strauss .................................... 326/81 |
| 5,455,732 | 10/1995 | Davis . |
| 5,539,335 | 7/1996 | Kobayashi et al. . |
| 5,600,266 | 2/1997 | Terrell et al. . |
| 5,635,861 * | 6/1997 | Chan et al. .............................. 326/81 |
| 5,646,550 * | 7/1997 | Campbell, Jr. et al. ................ 326/81 |
| 5,767,698 | 6/1998 | Emeigh et al. . |
| 5,852,382 | 12/1998 | Lentini et al. . |
| 6,028,450 * | 2/2000 | Nance ..................................... 326/81 |

\* cited by examiner

Primary Examiner—Patrick Wamsley
Assistant Examiner—Don Phu Le
(74) Attorney, Agent, or Firm—April M. Mosby; W. James Brady; Frederick J. Telecky, Jr.

(57) ABSTRACT

A three-state CMOS output buffer (200), having protective circuitry and an output node (OUT) connected to a bus, prevents damage to a connected integrated circuit when the bus voltage exceeds a power supply reference voltage ($V_{CC}$). A final output stage of the output buffer (200) includes a first pull-up transistor (QP200), a clamping transistor (QN202), and a pull-down transistor (QN204). A half-pass circuit (QN200) blocks the output voltage from propagating through the final output stage to damage the output buffer (200) when the output voltage applied to the output node (OUT) exceeds the supply voltage. The protective circuitry uses a clamping circuit (210), a switching circuit (212) and a backgate bias circuit (206) to prevent a leakage path between the output node (OUT) and the power supply reference ($V_{CC}$) through the source/bulk junction of biased transistors in the output buffer (200). The clamping circuit (210) turns the pull-up transistor (QP200) fully off when the output buffer (200) is enabled and an input signal ($V_{IN}$) is high and when the output buffer (200) is disabled. When the output buffer (200) is disabled, the switching circuit (212) turns the clamping circuit (210) off prior to turning the half pass circuit (QN200) and the pull-up transistor (QP200) off. The backgate bias circuit (206) provides a bias voltage equivalent to the power supply reference voltage ($V_{CC}$), as long as the bus voltage is not higher than the power supply reference voltage ($V_{CC}$), and bias equivalent to the bus voltage, when the bus voltage exceeds the power supply reference voltage ($V_{CC}$). Thus, the protective circuitry provides protection without a glitch of bus voltage propagating through the final output stage.

8 Claims, 4 Drawing Sheets

OUTPUT BUFFER FOR A LOW VOLTAGE DIFFERENTIAL SIGNALING RECEIVER

This application claims priority under 35 USC § 119(e)(1) of provisional application No. 60/121,357 filed Feb. 24, 1999.

FIELD OF THE INVENTION

This invention relates generally to the field of output buffers in high speed applications. In particular, the invention is related to circuitry within the output buffer of a 3.3V Low Voltage Differential Signaling receiver operable to prevent damage when the receiver is exposed to a voltage level above its supply voltage.

BACKGROUND OF THE INVENTION

Consumers are demanding more realistic, visual information in the office and in the home. Their demands are driving the need to move video, 3-D graphics, and photo-realistic image data from camera to personal computers and printers through local access network, phone, and satellite systems to home set top boxes and digital video cam recorders. Low Voltage Differential Signaling (LVDS) provides a solution to this consumer demand in a variety of applications in the areas of personal computing, telecommunications, and consumer/commercial electronics. It is an inexpensive and extremely high performance solution for moving this high speed digital data both very short and very long distances: on a printed circuit board and across fiber or satellite networks. Its low swing, differential signaling technology allows single channel data transmission at hundreds of megabits per second (Mbps). In addition, its low swing and current mode driver outputs create low noise, meeting FCC/CISPR EMI requirements, and provide a very low power consumption across frequency.

There are LVDS standards under two standards organizations: a Scalable Coherent Interface standard (SCI-LVDS) and an American National Standards Institute Telecommunications Industry Association Electronic Industries Association standard (ANSI/TIA/EIA). In an interest of promoting a wider standard, these standards define no specific process technology, medium, or power voltages. This means that LVDS can be implemented in CMOS, GaAs or other applicable technologies, migrating from 5 volts to 3.3 volts to sub-3 volt power supplies, and transmitting over PCB or cable thereby serving a broad range of applications. Thus, a valuable characteristic of LVDS is that the LVDS drivers and receivers do not depend on a specific power supply, such as 5 volts. Therefore, LVDS has an easy migration path to lower supply voltages such as 3.3 volts or even 2.5 volts, while maintaining the same signaling levels and performance.

Figure 1:
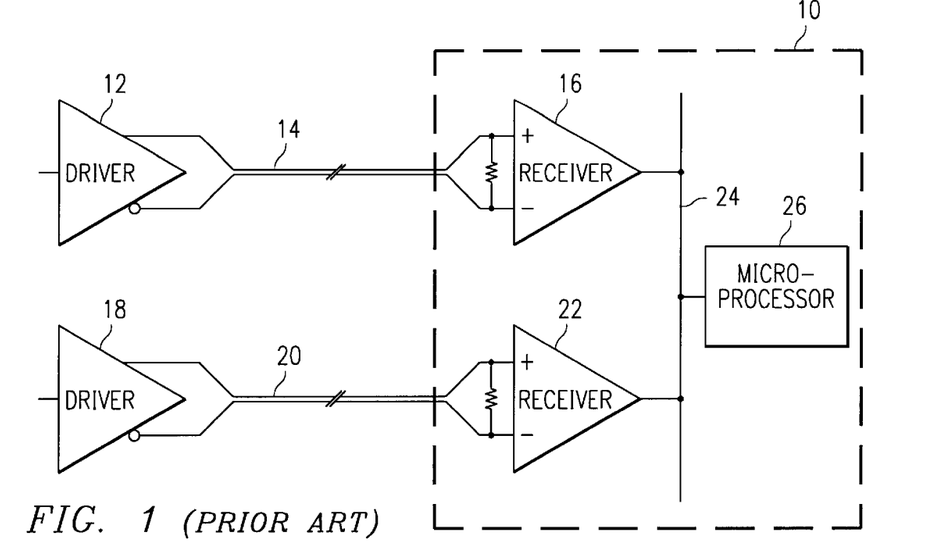
FIG. 1 is a diagram of a router configuration using LVDS receivers.

This same valuable characteristic of drivers and receivers independent of power supply specifications poses a disadvantage in that difficulty arises when there are several receivers of multiple voltages integrated within a LVDS application accessible to one bus. Such is the case as shown in FIG. 1 where a 3.3V LVDS receiver 16 and 5V LVDS receiver 22 use the same bus 24 within an LVDS application such as a telecommunication router 10. As discussed, the power supply of each receiver 16 and 22 may be any combination of either 2.5, 3.3, or 5 volts since LVDS technology standards require no specific power supply voltage. The router 10 receives two signals from the drivers 12 and 18 of two switches (not shown). Both LVDS drivers 12 and 18 are coupled to two respective LVDS buses 14 and 20.

At the opposite end of each LVDS bus 14 and 20, an LVDS receiver is coupled, 16 and 22, to each respective bus 14 and 20. The first receiver 16 has a 3.3V power supply and the second receiver 22 has a 5V power supply. Each LVDS receiver 16 and 22 is coupled to a bus 24 within the router 10 and generates current to drive a load attached to the bus 24. For this particular example, the load is a microprocessor 26. In operation, when one receiver accesses the bus 24, the other goes into a high impedance mode disabling itself from the bus 24. Accordingly, when each receiver 16 and 22 uses the bus 24, its power supply charges the bus 24. Thus, when the 5V receiver 22 gains access to the bus 24, its output buffer (not shown) drives the bus 24 from ground to 5 volts. The first receiver 16 at 3.3V power supply must be able to survive exposure to 5 volts during the high impedance mode without conduction of leakage currents flowing into the internal circuitry of the receiver 16. In summary, the output buffer of every receiver on the bus must be able to survive exposure to a voltage at least equal to the highest supply voltage of any receiver on the bus in order to prevent the conduction of leakage currents from flowing from the bus to the receiver.

Designing the output buffer of a 3.3 V LVDS receiver 16 using thick oxide 5 volt transistors is an approach towards preventing damage from exposure of higher power supply voltages. LVDS high speed applications, such as 400 Mbps applications, use fabrication processes suitable for high-speed, mixed signal designs. Yet, the implementation of thick oxide transistors in fabrication processes suitable for high-speed digital data has a negative impact on the speed of the receiver. Thus, the implementation of thick oxide transistors is not an acceptable solution.

Figure 2:
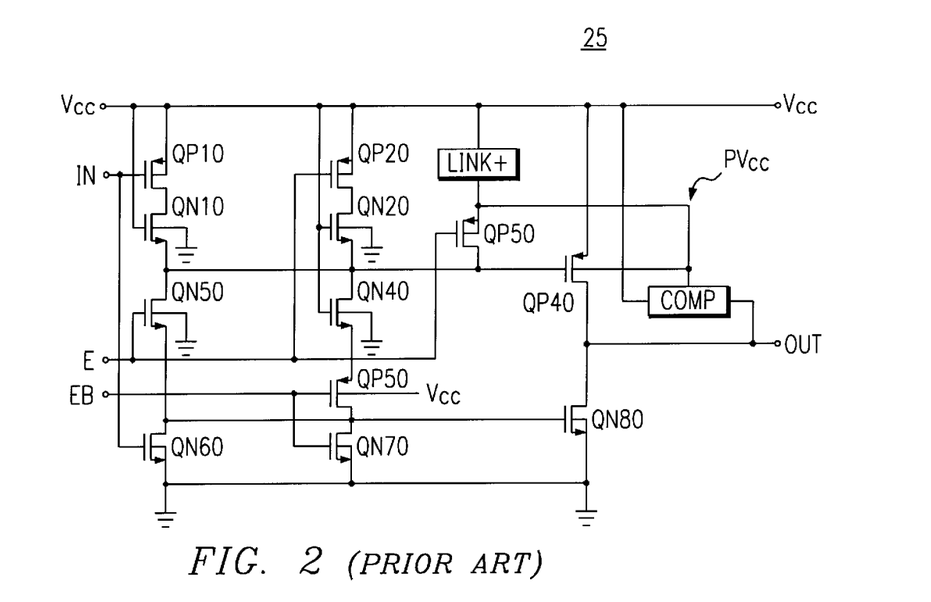
FIG. 2 is a schematic of a known output buffer with protective circuit.

As illustrated in FIG. 2, Davis describes a three-state output buffer circuit having a protection circuit in U.S. Pat. No. 5,455,732, which is hereby incorporated by reference. Davis provides a built-in protection against power-rail corruption by bus-imposed voltages when the buffer is in its high-impedance state. In particular the circuit uses a pseudo-power rail which can be used to adjust the bias on the output transistor's bulk and so to prevent a leakage path from occurring between the output node and a power rail via the output transistor source/bulk junction. NMOS transistor QN80 is the output pull-down transistor, driven by pull-down-transistor driver transistor QN60. Transistor QN70 is the pull-down transistor disabler. The gate of transistor QP10 is coupled to the input. QN10 is coupled in series to QP10. QN50 is coupled in series to QN10. QP20, QN20, QN40, QP50 and QN70 are all coupled in series with one another in this respective order. The enabling signal EB feeds the gates of transistors QP50 and QN70; while the enabling signal E feeds the gate of transistor QP20, QP30, and QN50. The source of QP30 is coupled to the circuit LINK+. The function of LINK+ is to enable the high-potential power rail to energize $PV_{CC}$, to be coupled to $V_{CC}$, but only when the voltage of the power rail is higher than that of the pseudo-rail $PV_{CC}$, the rail coupled to the node common to QP30 and LINK+. Pull-up transistor QP40, coupled to the drain of QP30, is coupled to the comparison circuit COMP. The output signal lead OUT taken from the node common to transistors QP40 and QN80 is coupled to the comparison circuit COMP.

This design, however, incorporates low turn-on threshold voltage transistors, QN10, QN20 and QN40, which increase the complexity of design and thus, cost. In addition, during the high impedance mode when the output buffer is disabled from the bus, the voltage applied to the gate of QP40 is $V_{CC}$ minus a threshold voltage of approximately 0.4 to 0.5 volts.

Accordingly, a leakage current will exist across this transistor QP40 when the voltage on the output lead OUT is greater than $V_{CC}$. Thus, this design does not eliminate leakage current completely. In addition, QP10 is required to be a thick oxide transistor which unfortunately has a negative impact on the speed of the receiver and, thus, is not an acceptable solution for high speed applications such as 400 Mbps applications using the fabrication processes suitable for high-speed, mixed signal designs.

Figure 3:
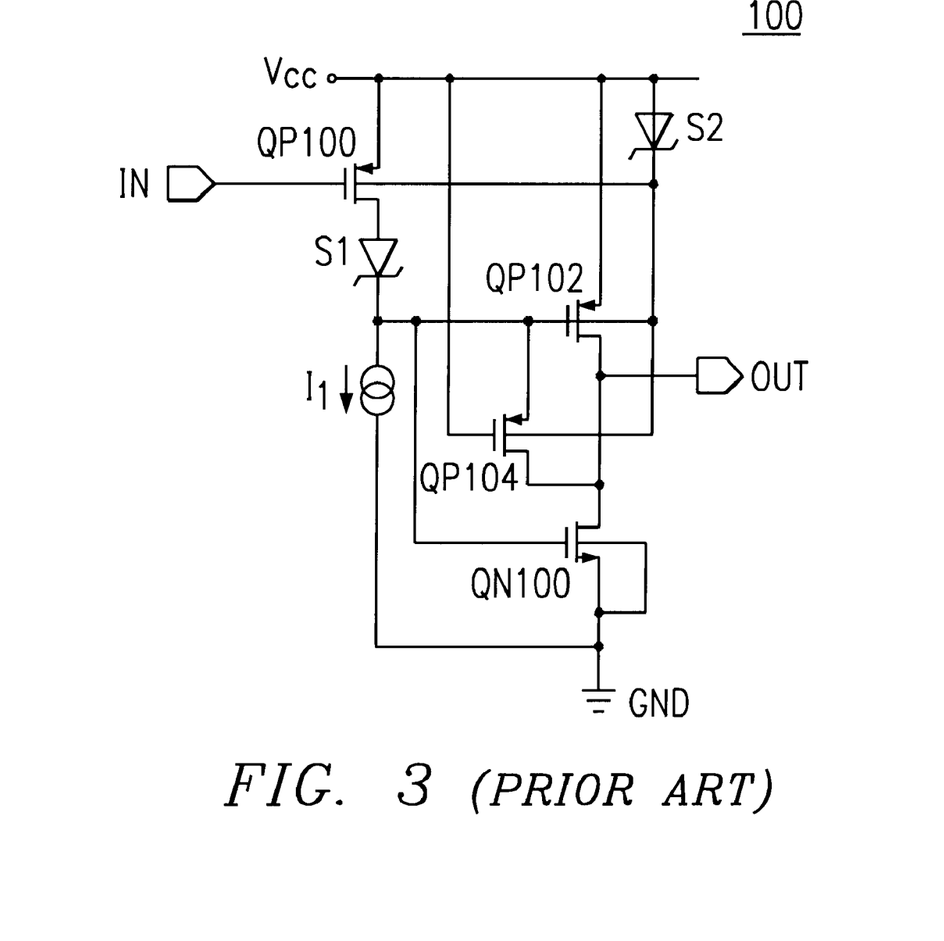
FIG. 3 is a schematic of another known output buffer for a LVDS receiver using Schottky diodes.

FIG. 3 illustrates a third design approach for implementation of the output buffer in a LVDS receiver using a first and second Schottky diode, S1 and S2 to prevent current from conducting into the output buffer. In addition to diodes S1 and S2, the output buffer 100 includes a plurality of p-channel transistors QP100, QP102 and QP104, an n-channel transistor QN100 and a current source $I_1$. Transistor QP100 has a source coupled to a first power supply rail $V_{CC}$, a gate coupled to an input node IN, a drain coupled to a first diode S1 and a backgate. The first Schottky diode S1 is coupled between transistor QP100 and the current source $I_1$. Transistor QP104 has a gate coupled to power supply rail $V_{CC}$. Transistor QP102 has a gate coupled to the source of transistor QP104 and the common node to Schottky diode S1 and current source $I_1$. The second Schottky diode S2 is coupled between the first power supply rail $V_{CC}$ and the backgates of transistors QP100, QP102 and QP104 for driving the output. The output node OUT and drains of transistors QP102 and QP104 are tied to the drain of transistor QN100. Transistor QN100 has a gate coupled to the input node IN and a backgate and source coupled to the second power supply rail GND.

In operation, when voltage applied to a bus coupled to the output node OUT is greater than the power supply reference voltage Vcc, p-channel transistor QP104 turns on. Accordingly, p-channel transistor QP102 turns off, preventing current from flowing into the first power supply rail $V_{CC}$. To prevent the backgate parasitic diodes of transistors QP100, QP102, and QP104 from conducting current though to the first power supply rail $V_{CC}$, a Schottky diode S2 is used to block this path from the output node OUT to the first power supply rail $V_{CC}$. In addition, the Schottky diode S1 blocks the voltage from damaging transistor QP100 and the rest of the circuitry internal to the receiver. Diode S1 also prevents current from conducting into the power supply rail $V_{CC}$. Unfortunately, many fabrication processes for LVDS do not include a Schottky diode design implementation; thus, this approach is not feasible. Fabrication processes that do include Schottky diode implementation typically suffer an increase in cost, gain in die area and increase in process complexity.

Figure 4:
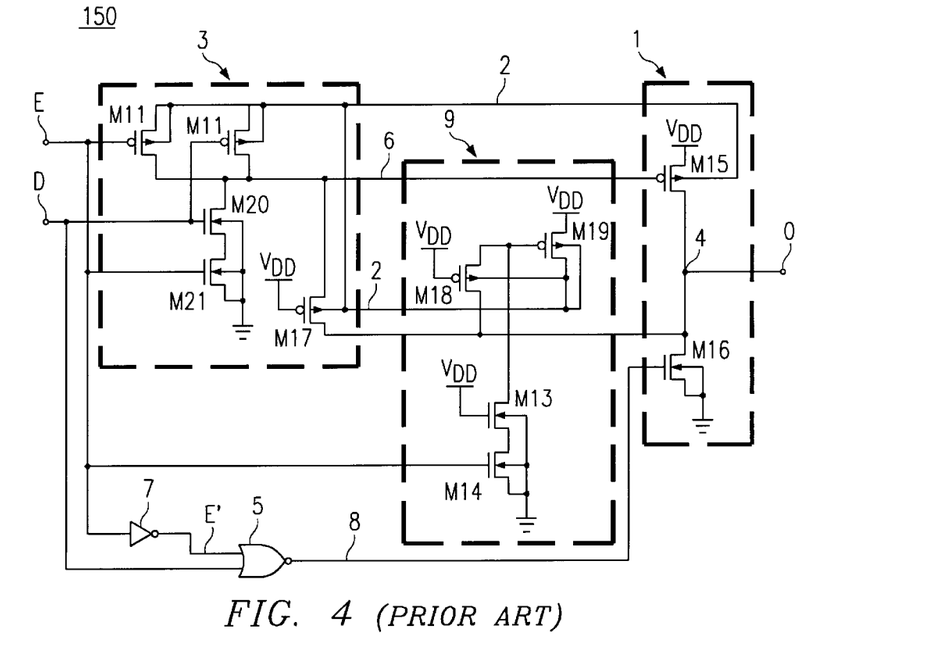
FIG. 4 is another schematic of a known output buffer with protective circuit.

Lentini et al describes a three-state CMOS output buffer circuit having a protective circuit in U.S. Pat. No. 5,852,382, which is hereby incorporated by reference. FIG. 4 illustrates the output buffer 150 which couples the bulk electrode of the pull-up transistor to a line whose voltage is always the highest between the supply voltage of the integrated circuit and the voltage of the external bus. The buffer 150 includes an inverter 7, a NOR gate 5, a NAND gate 3, an auxiliary circuit 9, a pull-up transistor M15, and a pull-down transistor M16. The pull-up transistor M15 has a bulk electrode connected to a switchable bulk line 2. The auxiliary circuit 9 keeps the switchable bulk line 2 connected to the voltage supply $V_{DD}$ as long as the voltage of the output node O is not higher than the supply voltage $V_{DD}$. The NAND gate 3 includes circuitry for transferring the voltage of the output node to the switchable bulk line when the voltage of the output node exceeds the supply voltage. This design, however, fosters significant damage to the integrated circuit when a voltage higher than 5 volts is applied to the external bus. In the high impedance mode, the enable/disable signal E is low. Since the enable signal is coupled to the gate of transistor M11, zero volts is applied to the gate. If, hypothetically, a voltage higher than 5 volts is applied to the external bus when the output buffer 150 is in the high impedance mode, this same voltage will be applied to the source of M11. Thus, transistor M11 will experience a gate to source voltage that is greater than 5 volts. Particularly in a process where the gate voltage cannot exceed 5 volts, M11 will be stressed and damaged. Even though this design eliminates leakage current, it does not protect the internal circuitry from exposure to a higher voltage and, thus, damage may result.

In conclusion, there are existing designs that use 3V transistors and circuit techniques to prevent damage to internal circuitry and to prevent conduction of leakage currents. These techniques, however, are either too slow for LVDS applications or use components not available in most LVDS fabrication processes because of the cost and complexity added to the process. Hence, a need exists for an output buffer design of an LVDS receiver that prevents damage of internal circuitry of the receiver when exposed to bus voltages higher than the output buffer's power supply voltage.

SUMMARY OF THE INVENTION

A three-state CMOS output buffer of an LVDS receiver has the capability to prevent voltage damage to the internal circuitry of the receiver and leakage current from exposure a voltage higher a supply voltage of the LVDS receiver on a common bus. The output buffer includes a final output stage, a half-pass circuit, a control circuit, an invertor, clamping circuit, and a switching circuit. The final output stage includes a first pull-up transistor, a clamping transistor, and a pull-down transistor connected respectively in series between a voltage supply and ground. The node common to the first pull-up transistor and the clamping transistor form an output node. The half-pass circuit couples to the final amplifier stage, the half pass circuit blocks the output voltage from propagating through to damage the output buffer when the output voltage applied to the output node exceeds the supply voltage.

The control circuit couples to the half-pass circuit. The control circuit is supplied with an input data signal, an enable/disable signal and a complemented enable/disable signal for activating and deactivating the final output stage. The invertor is coupled to the control circuit. The clamping circuit couples to the invertor and the final output stage to turn the pull-up transistor fully off when the output buffer is enabled and the input signal is high and when the output buffer is disabled.

The switching circuit connects to the half-pass circuit, the clamping circuit and the pull-up transistor, such that when the output buffer is disabled, the switching circuit turns the clamping circuit off prior to turning the half pass circuit and the pull-up transistor off for guarding the output buffer and the power supply rail against voltages applied to an output node of the buffer, when the voltage exceeds the supply voltage. The backgate bias circuit couples to the backgate of pull-up transistor, the clamping circuit, and the switching circuit. The backgate bias circuit supplies the supply voltage as long as the output node is not higher than a supply voltage. The backgate bias circuit supplies the output voltage to the backgates of the coupled transistors when the output node is higher than the supply voltage.

A technical advantage of the present invention is that it prevents damage from voltages supplied on a bus that is higher than its power supply. This increases the reliability and flexibility of the LVDS receiver in LVDS applications. It also makes the LVDS receiver compatible with requirements of modern applications.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Conventional three state CMOS output buffer circuits include a CMOS final driving stage, which in turn includes a p-channel MOSFET (pull-up) and a n-channel MOSFET (pull-down) connected in series between a voltage supply line VCC and a common ground (GND). The circuits further include control circuitry for the activation of the CMOS final driving stage; such control circuitry mixes the input data signal with an enable/disable signal for the activation of the three-state (or high impedance) mode, in which both the MOSFETs of the final stage are off. In its most simple form, the control circuitry includes a NAND gate, at whose inputs the input data signal and the enable/disable signal are applied and whose output drives the gate of the p-channel pull-up, and a NOR gate, at whose inputs the input data signal and the complemented enable/disable signal are applied and whose output drives the gate of the n-channel pull-down.

Figure 5:
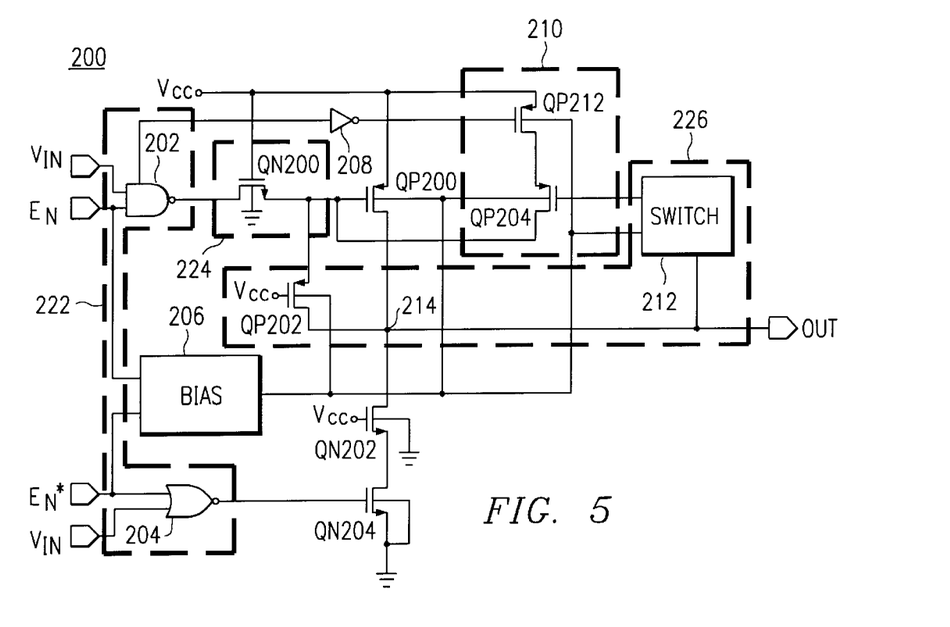
FIG. 5 is a partial logic gate and block diagram schematic of an output buffer for a LVDS receiver in accordance with the present invention.

FIG. 5 illustrates an embodiment of an output buffer 200 in accordance with the present invention. The three-state output buffer 200 includes a control circuit 222, a backgate bias circuit 206, a half pass circuit 224, a switching circuit 226, a pull-up transistor QP200, a clamping transistor QN202, a pull-down transistor QN204, an inverter 208, and a pull-up transistor circuit 210. The pull-up transistor QP200, clamping transistor QN202 and pull-down transistor QN204 form the final output stage of the output buffer 200. The control circuit 222 includes a NAND gate 202 and a NOR gate 204. The half-pass circuit 224 includes a transistor QN200. The switching circuit 226 includes a switch 212 and a switching transistor QP202. Connected in series between a voltage supply $V_{CC}$ and a common ground GND, lie the pull-up transistor QP200, the clamping transistor QN202, and the pull-down transistor QN204, respectively. The node 214 common to pull-up transistor QP200 and clamping transistor QN202 forms an output data signal node OUT.

NAND gate 202 includes inputs of the input data signal $V_{IN}$ and the enable/disable signal EN. NOR gate 204 includes inputs of the input data signal $V_{IN}$ and the complemented enable/disable signal EN*. The output node of NAND gate 202 is coupled to the drain of half-pass transistor QN200, while the output node of NOR gate 204 is coupled to the gate of pull-down transistor QN204. Backgate bias circuit 206 includes inputs from both enable/disable signals, EN and EN*. The output of backgate bias circuit 206 provides backgate bias for several of the transistors in the output buffer 200 as will be further explained. Transistor QN200 includes a gate coupled to the first power supply rail $V_{CC}$, a backgate coupled to the second power supply rail GND, and a source. A switching transistor QP202 includes a source coupled to the source of QN200, a gate coupled to the first power supply rail $V_{CC}$, a drain coupled to a node 214 and a backgate coupled to the output of backgate bias 206. Node 214 couples to an output node OUT. Pull-up transistor QP200 includes a gate coupled to the source of transistor QN200, a source coupled to the first power supply rail $V_{CC}$, a drain coupled to node 214 and a backgate coupled to the output of backgate bias circuit 206. Clamping transistor QN202 includes a gate coupled to the first power supply $V_{CC}$, a backgate coupled to the second power supply rail GND, a drain coupled to node 214 and a source. Pull-down transistor QN204 includes a drain coupled to the source of transistor QN202 and a directly coupled backgate and source that are coupled to the second power supply rail GND. a pull-up transistor circuit 210 comprises transistor QP212 and QP204. Transistor QP204 includes a backgate tied to the output of backgate bias circuit 206, a drain coupled to the gate of transistor QP200, a source and a gate. Transistor QP212 includes a drain coupled to the source of transistor QP204, a backgate coupled to the output of backgate bias circuit 206, a source coupled to first power supply rail $V_{CC}$ and a gate. Inverter 208 is coupled between the gate of QP212 and the output of NAND gate 202. Switching circuit 212 receives inputs from the gate of QP204, the output of backgate bias circuit 206 and generates an output to node 214.

Figure 6:
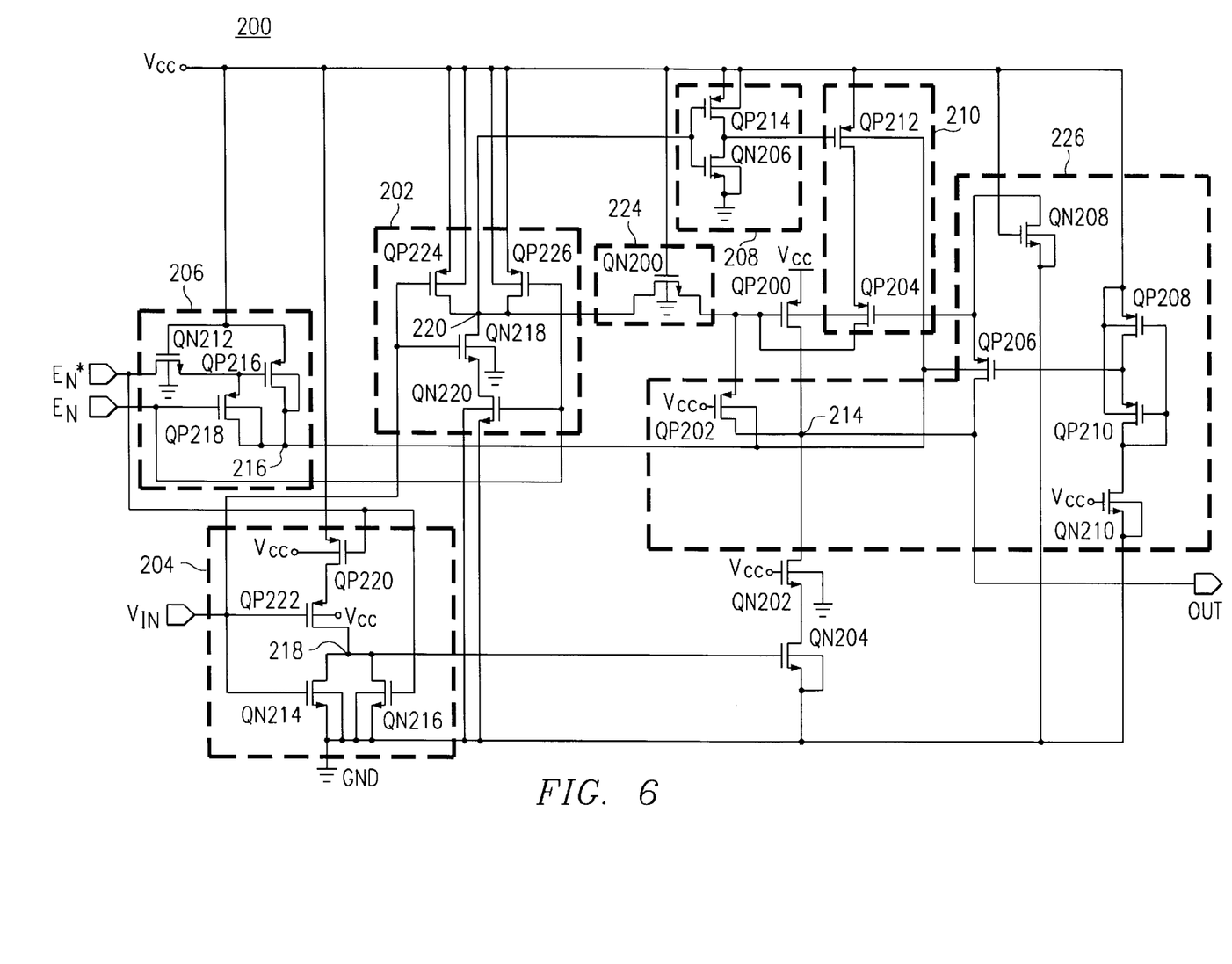
FIG. 6 is a more detailed schematic of FIG. 5.

FIG. 6 illustrates in further detail the design of the buffer 200 represented in FIG. 5. Specifically NAND gate 202 includes p-channel transistors, QP224 and QP226, and n-channel transistors, QN218 and QN220. NAND gate 202 applies the power supply reference voltage Vcc to the gate of QN200 during the high impedance mode. Transistors QP224 and QP226 have directly coupled sources and backgates that couple to power supply rail $V_{CC}$. Transistors QP224 and QP226 also include directly coupled drains that are coupled to node 220. Node 220 couples to the drain of transistor QN218 as well as the drain of transistor QN200. Transistor QN218 includes a source and a backgate that is coupled to the second power supply rail GND. Transistor QN220 includes a drain coupled to the source of transistor QN218, a gate coupled to the gate of QP226 and a directly coupled backgate and source that couple to the second power supply rail GND. Input data signal $V_{IN}$ ties to the gates of transistors QP224 and QN218.

NOR gate 204 includes p-channel transistors, QP220 and QP222, and n-channel transistors, QN214 and QN216. The NOR gate 204 is used to ground the gate of pull-down transistor QN204 during the high impedance mode. Transistor QP220 has a drain, a gate, and a directly coupled backgate and source that couple to the first power supply rail $V_{CC}$. Transistor QP222 has a source coupled to the drain of transistor QP220 and a backgate coupled to the first power supply rail $V_{CC}$. Transistors QN214 and QN216 include directly coupled drains connected to the source of transistor QP222 to form the output node 218 of NOR gate 204.

Transistors QN214 and QN216 also include directly coupled backgates and sources that connect to the second power supply rail GND. Input data signal $V_{IN}$ ties to the gates of transistors QN214 and QP222.

Backgate bias circuit 206 includes transistor QN212, QP216 and QP218. Transistor QN212 includes a drain coupled to a complemented enable/disable signal EN*, a backgate coupled to a second power supply rail GND, a gate coupled to the first power supply rail $V_{CC}$ and a source coupled to the gate of transistor QP216 and the source of transistor QP218. Transistor QP216 has a source coupled to the first power supply rail $V_{CC}$ and a directly coupled backgate and drain that are coupled to backgate reference node 216. Transistor QP218 has a directly coupled backgate and drain tied to backgate reference node 216 as well. The gate of transistor QP218 connects to enable/disable signal EN, the complemented enable/disable signal EN* for enabling specific portions of the circuit to operate relative to the input data signal $V_{IN}$. Enable/disable signal EN couples to the gates of transistors QP226 and QN220; while complemented enable/disable signal EN* couples to the gate of transistors QN216 and QP220.

Inverter 208, comprising transistor QP214 and QN206, serves as a buffer to prevent voltage from propagating back to NAND gate 202. Transistor QP214 has a directly coupled backgate and source that are coupled to the first power supply rail $V_{CC}$. Transistor QP214 includes a gate coupled to node 220 and a drain coupled to the gate of transistor QP212. Transistor QN206 includes a drain coupled to the drain of transistor QP214, a gate coupled to node 220, and a directly coupled backgate and drain that are coupled to the second power supply rail GND.

Switching circuit 212 includes p-channel transistors QP206, QP208, QP210 and n-channel transistors QN208 and QN210. Transistor QN208 includes a drain coupled to the gate of transistor QP204, a gate coupled to the first power supply rail $V_{CC}$, and a directly coupled backgate and source that are coupled to the second power supply rail GND. Transistor QP206 includes a gate, a source coupled to the drain of transistor QN208, a drain coupled to output node OUT, and a backgate coupled to backgate reference node 216. Transistor QP208 includes a directly coupled backgate and source that are coupled to first power supply rail $V_{CC}$, a gate and a drain. Transistor QP210 includes a source coupled to the drain of transistor QP208, a directly coupled drain and gate that are coupled to the gate of transistor QP208, and a backgate coupled to first power supply rail $V_{CC}$. Transistor QN210 includes a gate tied to first power supply rail $V_{CC}$, a drain coupled to the drain of QP210 and a directly coupled backgate and source that are coupled to the second power supply rail GND.

During operation when the output buffer 200 is enabled, the enable/disable signal EN is high ("1") and its complemented signal EN* is low ("0"). In this state, the output node 220 of NAND gate 202 and the output node 218 of NOR gate 204 are high or low relative to the logic state of the input data signal $V_{IN}$. More particularly, when the input signal $V_{IN}$="0", this input signal $V_{IN}$ applied to transistors QP224 and QN218 turns transistor QP224 on and transistor QN218 off. Transistor QP224 pulls node 220 to power supply reference voltage $V_{CC}$ or high. The high enable/disable signal EN applied to the gates of transistors QP226 and QN220 turns transistor QP226 off and transistor QN220 on. The input signal $V_{IN}$ applied to transistors QP222 and QN214 turns transistor QP222 on and transistor QN214 off. The complemented enable/disable signal EN* applied to the gates of transistors QP220 and QN216 turns transistor QP220 on and transistor QN216 off. Transistors QP220 and QP222 drive node 218 high. Thus, the output node 218 of NOR gate 204 is "1" and the output node 220 of NAND gate 202 is "1."

Since node 220 is high, when it is applied to n-channel field effect transistor QN200, transistor QN200 turns off. Node 220 applies a high to the gates of transistors QP214 and QN206. As a result, transistor QP214 turns off and QN206 turns on. Transistor QN206 pulls the gate of transistor QP212 to ground, turning transistor QP212 on. Transistor QP212 drives the source of transistor QP204 high and transistor QN208 of switching circuit 226 applies a ground to the gate of transistor QP204. Thus, transistor QP204 turns on. Transistor QP204 drives the gate of transistor QP200 high, turning this transistor off. In addition, transistor QP204 drives the source of transistor QP202 high, turning this transistor off.

The high ("1") signal from node 218 of NOR gate 204, coupled to the gate of transistor QN204, turns transistor QN204 on. As a result, transistor QN204 pulls the source of transistor QN202 to ground and transistor QN202 turns on. Thus, the output OUT is pulled to ground.

Transistors QP208, QP210, QN208, and QN210 are always on during the enable of output buffer 200. They supply a voltage reference for the switch 226. As a result, the voltage applied to the gate of transistor QP206 is high, which turns this transistor off.

In an effort to prevent leakage current from the output to the power supply reference $V_{CC}$, transistors QN212, QP216, and QP218 of backgate bias circuit 206 supply a backgate reference voltage through backgate reference node 216. During enable mode, transistor QN212 and QP216 are on. Transistor QP218 is off. Thus, during the enable mode, the backgate reference node 216 is driven by transistor QP216 to high. Backgate reference node 216 is tied to the backgates of transistors QP202, QP212, QP206 and drives these backgates to the power supply voltage $V_{CC}$.

Conversely, when the output buffer 200 is enabled and the voltage at input data signal $V_{IN}$ is a "1", the output node of 218 of NOR gate 204 is "0" and the output node 220 of NAND gate 202 is "0." Specifically, when the input signal $V_{IN}$="1", this input signal $V_{IN}$ applied to transistors QP224 and QN218 turns transistor QP224 off and transistor QN218 on. The high enable/disable signal EN applied to the gates of transistors QP226 and QN220 turns transistor QP226 off and transistor QN220 on. Thus, transistors QN220 and QN218 pull node 220 to ground. The input signal $V_{IN}$ applied to transistors QP222 and QN214 turns transistor QP222 off and transistor QN214 on. The complemented enable/disable signal EN* applied to the gates of transistors QP220 and QN216 turns transistor QP220 on and transistor QN216 off. Thus, transistor QP220 pulls node 218 to ground. The low at node 218 applied to transistor QN204, turns transistor QN204 off. Transistor QN202 turns off. The low of node 220 turns transistor QN200 on. Transistor QN200 applies a low to the gate of transistor QP200 and the source of transistor QP202. Transistor QP202 remains off and transistor QP200 turns on, driving the output node OUT high.

Node 220 applies a low to the gates of transistors QP214 and QN206. As a result, transistor QP214 turns on and QN206 turns off. Transistor QP214 pulls the gate of transistor QP212 to power supply reference voltage $V_{CC}$, turning transistor QP212 off. As a result, transistor QP204 is off.

As stated above, transistors QP208, QP210, QN208, and QN210 are always on during the enable of output buffer 200. They supply a voltage reference for the switch 226. As a result, the voltage applied to the gate of transistor QP206 is high, which keeps this transistor off.

Assuming now that the output buffer circuit is disabled, i.e. in the high impedance mode, EN="0", EN*="1." Given that the voltage at the output node OUT is less than the power supply voltage VCC plus the threshold voltage minus 300 mV, the enable/disable signal EN applied to transistors QP226 and QN220 turns transistor QP226 on and transistor QN220 off. Transistor QP226 drives node 220 high. Thus, the output node 220 of NAND gate 202 is always a "1" during the high impedance mode independent of the input signal $V_{IN}$. Likewise, the complemented enable/disable signal EN* applied to transistors QP220 and QN216 turns transistor QP220 off and transistor QN216 on. Transistor QN216 pulls node 218 to ground. Node 218 will remain at ground during the high impedance mode independent of the input signal $V_{IN}$.

Since node 220 is high, transistor QN200 is off. Node 220 applies a high to the gates of transistors QP214 and QN206. As a result, transistor QP214 turns off and QN206 turns on. Transistor QN206 pulls the gate of transistor QP212 to ground, turning transistor QP212 on. Transistor QP212 drives the source of transistor QP204 high and transistor QN208 of switching circuit 226 applies a ground to the gate of transistor QP204. Thus, transistor QP204 turns on. Transistor QP204 drives the gate of transistor QP200 high, turning this transistor off. In addition, transistor QP204 drives the source of transistor QP202 high, turning this transistor off.

Node 218 applies "0" to the gate of pull-down transistor QN204, turning this transistor off. Transistor QN202 is off as a result of transistor QN204 turning off. Thus, the final stage of the output buffer 200, pull-up transistor QP200, clamping transistor QN202, and pull down transistor QN204, are turned off. The output node OUT of the output buffer 30 is in a high-impedance condition.

Since enable/disable signal EN is applied to the gate of transistor QP218, transistor QP218 turns on. Given the voltage of output node OUT is between the power supply voltage $V_{CC}$ and the power supply voltage $V_{CC}$ plus the threshold voltage minus the 300 mV, a voltage higher that the power supply voltage $V_{CC}$ will be applied to the drain and backgate of transistor QP216, turning this transistor off. The complemented enable/disable signal EN* is applied to the gate of transistor QN212 and, as a result, transistor QN212 turns on slightly, having a source voltage one threshold voltage beneath the power supply voltage $V_{CC}$. Thus, backgate reference node 216 remains at the power supply voltage $V_{CC}$. Backgate reference node 216 is tied to the backgates of transistors QP202, QP212, QP206.

Given the voltage applied to the output node OUT rises one threshold voltage $V_t$ above the power supply rail voltage $V_{CC}$ minus 300 mV, transistor QP206 will turn on since the reference voltage supplied by transistors QP208, QP210, QN208 and QN210 will always be one threshold voltage $V_t$ below $V_{CC}$ (approximately 300 mv for 3V processes). As a result, transistor QP204 turns off which keeps pull-up transistor QP200 off during the high impedance mode.

Since enable/disable signal EN is applied to the gate of transistor QP218, transistor QP218 turns on. Given the voltage of output node OUT is the power supply voltage $V_{CC}$ plus the threshold voltage minus the 300 mV, a voltage higher that the power supply voltage $V_{CC}$ will be applied to drain and backgate of QP216, keeping this transistor off. The complemented enable/disable signal EN* is applied to the gate of transistor QN212 and, as a result, transistor QN212 turns on slightly, having a source voltage one threshold voltage beneath the power supply voltage $V_{CC}$. Thus, backgate reference node 216 remains at the power supply voltage $V_{CC}$. Backgate reference node 216 is tied to the backgates of transistors QP202, QP212, QP206.

Given another output buffer circuit is on the bus coupled to the output node OUT supplying an output voltage one threshold voltage higher than Vcc, the output voltage will be applied to the drain of QP202. The parasitic diode of QP202 will conduct the output voltage across its drain to its backgate which is coupled to backgate reference node 216. As a result, the voltage at the output node OUT appears at backgate reference node 216. The backgate reference node applies this voltage to the drain and backgate of transistor QP218 which is on. QP218 pulls the voltage of the source of transistor QN212 up to the voltage at the output node. Transistor QN212 turns off. Effectively, transistor QN212 clamps the output voltage from entering the rest of the integrated circuit coupled to the output buffer 200.

To summarize the function of the backgate bias circuit 206, when the output voltage is less than the power supply voltage Vcc plus the threshold voltage, transistors QN212 and QP218 supply backgate reference node 216 a voltage equivalent to that applied to complemented enable/disable signal EN*, which equals power supply voltage Vcc. When the output voltage rises above Vcc plus the threshold voltage, the output voltage is applied to backgate reference node 216. This keeps the backgate reference node 216 always tied to the highest potential, either the power supply reference voltage $V_{CC}$ or the output voltage, thus keeping the transistors QP202, QP212 and QP206 off in the condition where the output signal rises above Vcc.

Accordingly, as the voltage applied to the output node OUT rises one threshold voltage $V_t$ above the power supply rail voltage $V_{CC}$, transistor QP202 turns on. Transistor QP202 applies the output voltage to the gate of transistor QP200 and the source of QN200, turning transistor QN200 off. If transistor QP204 had not been turned off prior to transistor QP202 turning on, a leakage current would propagate through transistor QP202 to the power supply reference $V_{CC}$. Thus, turning off transistor QP204, prior to the turning on of transistor QP202, prevents a small amount of leakage current from propagating through transistor QP202 to the power supply reference $V_{CC}$. In addition, turning transistor QN200 off blocks the output voltage from propagating through QN200 to rest of the circuitry. Thus, the embodiment of the present invention prevents damage to the circuitry and leakage current from flowing through to the power supply rail $V_{CC}$ by blocking an output voltage in excess of the power supply voltage $V_{CC}$.

Those skilled in the art to which the invention relates will appreciate that various substitutions, modifications and additions can be made to the described embodiments, without departing from the spirit and scope of the invention as defined by the claims.

What is claimed is:

1. A three-state CMOS output buffer having a first power supply reference voltage, second power supply reference voltage, and an output coupled to a bus, the bus having a voltage, the three-state CMOS output buffer comprising:

a final output stage comprising a pull-up transistor, a clamping transistor, and a pull-down transistor connected respectively in series between a power supply rail and ground and having an common output node between the clamping transistor and the pull-up transistor;

a half-pass circuit coupled to the final output stage, the half-pass circuit blocks the bus voltage from propagating through to damage the output buffer when the output voltage applied to the output node exceeds the first power supply reference voltage;

a control circuit coupled to the half-pass circuit, the control circuit supplied with an input data signal, an enable/disable signal and a complemented enable/disable signal for activating and deactivating the final output stage;

an invertor coupled to the control circuit;

a clamping circuit coupled to the invertor and the final output stage to turn the pull-up transistor fully off when the output buffer is enabled and the input data signal is low and when the output buffer is disabled;

a switching circuit coupled to the half-pass circuit, the clamping circuit and the pull-up transistor, such that when the output buffer is disabled, the switching circuit turns the clamping circuit off prior to turning the half pass circuit and the pull-up transistor off for guarding the output buffer and the first power supply against voltages applied to the output node of the buffer that exceed the first power supply reference voltage; and a backgate bias circuit coupled to the backgate of the pull-up transistor, the clamping circuit, and the switching circuit, the backgate bias circuit supplies the first power supply reference voltage as long as the output node is not higher than a supply voltage, the backgate bias circuit supplies the output voltage when the output node is higher than the first power supply reference voltage.

2. The three-state CMOS output buffer of claim 1, wherein the half-pass circuit includes a first transistor, the first transistor connected between the control circuit and the pull-up transistor, the first transistor having a gate coupled to the first power supply reference voltage and a backgate coupled to ground.

3. The three-state CMOS output buffer of claim 1, wherein the control circuit comprises:

a first logic gate supplied with an input data signal and an enable/disable signal, the first logic gate driving the pull-up transistor; and a second logic gate supplied with an input data signal and the complement of the an enable/disable signal, the first and second logic gates responsive to the enable/disable signal for activating a three-state mode in which the pull-up transistor and the pull-down transistor are both deactivated.

4. The three-state CMOS output buffer of claim 3, wherein the first logic gate includes an output node and at least two input nodes and comprises a NAND gate having a first transistor, a second transistor, a third transistor and a fourth transistor, the first transistor and the second transistor coupled between the voltage supply and the output node of the first logic gate, the third transistor coupled between the fourth transistor and the coupled first and second transistors, the first and third transistors coupled to a first one of the two input nodes, the second and fourth transistors coupled to the second one of the two input nodes.

5. The three-state CMOS output buffer of claim 3, wherein the second logic gate including a output node and at least two input nodes, the first input node coupled to the input data signal, the second input node coupled to the enable/disable signal, comprises a NOR gate having a first transistor, a second transistor, a third transistor and a fourth transistor, the first transistor coupled between the voltage supply and the second transistor, the third transistor and the fourth transistor coupled between the second transistor and ground, the second and third transistors coupled to the first input node, the first and fourth transistors coupled to the second input node.

6. The three-state CMOS output buffer of claim 1, wherein the clamping circuit comprises a first transistor and an second transistor coupled in series between the voltage supply and a gate of the pull-up transistor, the first transistor and the second transistor having a backgate coupled to the backgate bias circuit.

7. The three-state CMOS output buffer of claim 1, wherein the switching circuit comprises:

a first transistor coupled between the clamping circuit and the output node, the first transistor having a backgate coupled to the backgate bias circuit and a gate;

a second transistor having a drain coupled to the source of the first transistor, a gate coupled to the first power supply reference voltage, and a directly coupled backgate and source, the directly coupled backgate and source couple to ground;

a third transistor having a gate, a drain coupled to the gate of the first transistor and a directly coupled backgate and source, the directly coupled backgate and source couple to the first power supply reference voltage;

a fourth transistor having a directly coupled gate and drain, a backgate coupled to the first power supply reference voltage, a source coupled to the drain of the third transistor; and a fifth transistor having a drain coupled to the gate of the fourth transistor, a gate coupled to the first power supply reference voltage and a directly coupled backgate and source coupled to ground.

8. The three-state CMOS output buffer of claim 1, wherein the backgate bias circuit comprises:

a first transistor having a drain coupled to the complemented enable/disable signal, a backgate coupled to ground, a gate and a source;

a second transistor having a gate coupled to the source of the first transistor, a source coupled to the gate of the first transistor, and a directly coupled backgate and drain to form a bias output node; and a third transistor having a source coupled to the gate of the second transistor, a gate coupled to the enable/disable signal, and a directly coupled backgate and drain coupled to the bias output node.

\* \* \* \* \*